(12) United States Patent
Broghammer et al.

(10) Patent No.: US 7,313,001 B2
(45) Date of Patent: Dec. 25, 2007

(54) ELECTRICAL SWITCH HAVING A MOUNT FOR AN ELECTRICAL CIRCUIT

(75) Inventors: Peter Broghammer, Wurmlingen (DE); Peter Wahl, Villingen-Schwenningen (DE)

(73) Assignee: Marquardt GmbH (DE)

( * ) Notice: Subject to any disclaimer, the term of this patent is extended or adjusted under 35 U.S.C. 154(b) by 380 days.

(21) Appl. No.: 10/471,413

(22) PCT Filed: Mar. 22, 2002

(86) PCT No.: PCT/DE02/01044

§ 371 (c)(1),
(2), (4) Date: Sep. 11, 2003

(87) PCT Pub. No.: WO02/078029

PCT Pub. Date: Oct. 3, 2002

(65) Prior Publication Data

US 2004/0085740 A1   May 6, 2004

(30) Foreign Application Priority Data

Mar. 24, 2001   (DE) ............................. 101 14 572

(51) Int. Cl.
   *H05K 1/18*   (2006.01)
(52) U.S. Cl. .................. 361/761; 361/700; 361/760
(58) Field of Classification Search ........ 361/700–710; 174/255–261; 257/690–692
See application file for complete search history.

(56) References Cited

U.S. PATENT DOCUMENTS

| | | | | |
|---|---|---|---|---|
| 4,404,059 A | * | 9/1983 | Livshits et al. ............... 216/17 |
| 4,698,471 A | * | 10/1987 | Piber .......................... 200/302.2 |
| 4,802,532 A | * | 2/1989 | Dawes et al. ............... 165/80.3 |
| 5,055,967 A | * | 10/1991 | Sukonnik et al. ........... 361/706 |
| 5,179,501 A | * | 1/1993 | Ocken et al. ............... 361/709 |
| 5,198,693 A |   | 3/1993 | Imken et al. |
| 5,198,793 A | * | 3/1993 | Leveque ..................... 338/172 |
| 5,208,734 A | * | 5/1993 | Someno ...................... 361/706 |
| 5,289,047 A | * | 2/1994 | Broghammer .............. 307/125 |
| 5,355,280 A | * | 10/1994 | Rothlingshofer et al. ... 361/705 |
| 5,497,291 A | * | 3/1996 | Hosen ......................... 361/804 |
| 5,546,275 A | * | 8/1996 | Moutrie et al. ............. 361/707 |
| 5,661,343 A | * | 8/1997 | Takahashi et al. .......... 257/723 |
| 6,200,407 B1 | * | 3/2001 | Wieloch et al. ............. 156/252 |
| 6,355,885 B1 | * | 3/2002 | Rintz et al. .................. 174/66 |
| 6,555,775 B1 | * | 4/2003 | Van Bokhoven et al. ... 200/522 |

FOREIGN PATENT DOCUMENTS

DE        36 29 976 A1     4/1988

(Continued)

*Primary Examiner*—Tuan T. Dinh
(74) *Attorney, Agent, or Firm*—Venable LLP; Thomas G. Wiseman

(57) ABSTRACT

The invention relates to an electrical circuit arrangement (3) having electrical and/or electronic components (4). The components (4) are arranged on a mount substrate (5). The conductor tracks (6) for electrical connection of the components (4) are also located on the mount substrate (5). The mount substrate (5) comprises a metal part (7). An electrically insulating coating (9) is applied to one surface (8) of the metal part (7), to be precise in particular to that surface (8) which faces the components (4) and the conductor tracks (6). At least one component (4) and/or at least one conductor track (6) are/is located on the coating (9).

23 Claims, 4 Drawing Sheets

FOREIGN PATENT DOCUMENTS

| | | |
|---|---|---|
| DE | 3629976 A1 * | 4/1988 |
| DE | 41 14 854 A1 | 11/1992 |
| DE | 196 41 397 A1 | 4/1998 |
| DE | 19641397 A1 * | 4/1998 |
| DE | 100 19 471 A1 | 3/2001 |
| JP | 62-199437 | 9/1987 |
| JP | 05-218606 | 8/1993 |
| JP | 06-053344 | 2/1994 |
| JP | 06-177295 | 6/1994 |
| JP | 08-139423 | 5/1996 |
| JP | 11-157396 | 6/1999 |
| WO | WO 00/42654 | 7/2000 |

* cited by examiner

ELECTRICAL SWITCH HAVING A MOUNT FOR AN ELECTRICAL CIRCUIT

BACKGROUND OF THE INVENTION

1. Field of the Invention

The invention relates to an electrical switch as claimed in the precharacterizing clause of patent claim 1.

2. Description of Related Art

Electrical circuits which are arranged on a board have a wide field of use, for example in controllers, domestic electrical appliances or electrical tools. In particular, circuits such as these which are used for driving an electric motor in an electrical tool are arranged together with the board in the housing of the switch for the electrical tool.

An electrical circuit arrangement such as this has electrical and/or electronic components. The components are arranged on a mount substrate, with the conductor tracks for electrical connection of the components likewise being located on the mount substrate. A switch for an electrical tool, in particular for an electrical tool which is powered by a rechargeable battery and in whose housing the mount substrate of the drive circuit is accommodated, is disclosed, for example, in DE 41 14 854 A1. The mount substrate comprises a printed circuit board, for example based on hard-paper or FR4 technology, or else is a ceramic panel.

During operation of the electrical circuit arrangement, heat is produced in the components. These heat losses must be dissipated and this is done via the printed circuit board and the heat sink, in order to prevent thermal damage to the components, and hence destruction of the surface arrangement. It has been found that the printed circuit boards limit the effective dissipation of the heat in the case of circuit arrangements with relatively high heat losses. Particularly in the case of electrical switches for high-power electrical tools, in which a circuit arrangement is arranged for controlling the rotation speed, or for torque disconnection or the like in the housing of the switch, this has resulted in corresponding adverse effects, and even to premature failure of the switch. This problem is particularly relevant to electrical tools which are powered by rechargeable batteries where high currents flow through the switch.

An electrical switch for electrical tools having a housing which is formed from two housing halves, with one housing half being produced from metal, is also known from DE 100 19 471 A1. An electrical circuit arrangement is located on a mount substrate in the interior of the housing. The mount substrate rests against the housing half that is composed of metal, so that this housing half acts as a heat sink. However, since the mount substrate is in turn composed in a conventional manner of ceramic material, plastic or the like, the dissipation of the heat losses is also restricted in this case.

Finally, a voltage regulator for a generator in a motor vehicle is disclosed in DE 36 29 976 A1. The voltage regulator is arranged on a mounting plate, as a hybrid circuit composed of various components and a power semiconductor. The mounting plate is composed of highly thermally conductive material, for example steel, aluminum or copper, and has a thin, electrically insulating coating. Since the mounting plate is in the form of a metal part, this ensures improved dissipation of the heat losses. However, the physically large voltage regulator for the motor vehicle does not provide any information relating to the arrangement of a metallic mounting plate in a physically small housing for an electrical switch.

BRIEF SUMMARY OF THE INVENTION

The invention is based on the object of providing an electrical switch which contains an electrical circuit arrangement with better heat dissipation. In particular, one aim is to improve the heat dissipation from an electrical switch which is used in a high-power electrical tool.

For an electrical switch of this generic type, this object is achieved by the characterizing features of claim 1.

The mount substrate for the circuit arrangement for the electrical switch according to the invention comprises a metal part. An electrically insulating coating is applied to one surface of the metal part, to be precise in particular to the surface which faces the components and the conductor tracks. At least one component and/or at least one conductor track are/is located on the coating. A circuit arrangement such as this allows the heat losses which are produced in the components to be dissipated particularly efficiently. Further refinements of the invention are the subject matter of the dependent claims.

The metal part is preferably composed of aluminum or of an aluminum alloy, for example of an AlMg3 alloy. An anodized aluminum layer, in particular with a thickness of approximately 30 to 50 μm, may be used as the electrically insulating coating. An anodized aluminum layer such as this not only has high thermal conductivity but also good electrical insulation and is thus particularly suitable for the electrical switch according to the invention.

However, the metal part may also be composed of some other highly thermally conductive metal, such as copper, steel or the like, or of a metal alloy. The metal part is expediently in the form of a plate, whose thickness is, for example, at least 2 mm. A ceramic layer may be used for the electrically insulating coating. The ceramic material, which is, in particular, a ceramic paste, may be printed, rolled, sprayed or the like onto the surface of the metal part. If necessary, this layer may subsequently be burnt in. A polymer layer, such as an epoxy layer or the like, may also be used as the electrically insulating coating. The polymer material, which is, in particular, a polymer resin, may be printed, sprayed, rolled or the like onto the surface of the metal part. If necessary, this layer is then cured. Finally, it is possible to use a film, in particular a plastic film, for the electrically insulating coating. The film material may be adhesively bonded, laminated or the like onto the surface of the metal part. The coatings which have been mentioned are distinguished by simple production. Furthermore, an electrically insulating coating such as this means that it is possible to achieve a dielectric strength of at least 400 V for DC applications, and a dielectric strength of at least 2 kV for AC applications.

In a development which saves individual parts, the metal part itself is in the form of a heat sink. Cooling ribs may then be fitted to the surface which faces away from the electrically insulating coating. A metal part such as this may be produced from an extruded body.

Thick film technology may be used as a simple method for producing the conductor tracks on the electrically insulating coating. For this purpose, the conductor tracks are composed of copper, silver palladium or the like, with the paste, such as the copper paste, silver palladium paste or the like, being applied to the coating in a manner corresponding to the layout for the conductor tracks. Printed resistors can likewise be applied to the coating by means of a resistance paste. The conductor tracks and/or the printed resistors are then burnt in. The components may be soldered onto the electrically insulating coating in a vacuum.

At least one component of the circuit arrangement is often a power semiconductor, resulting in increased heat losses. In a situation such as this, the coating may have a cutout, such that the power semiconductor is mounted directly on the metal part, which in turn improves the heat dissipation. In order to prevent heat from accumulating on the power semiconductor itself, it is also possible, if necessary, for the power semiconductor to be in the form of a chip without a housing, with a bonded connection for the conductor track on the coating. If the heat losses allow, it is also possible for the power semiconductor to be mounted on the coating, of course.

The electrical switch according to the invention, is used in particular in electrical tools, for example in an electrical tool which is powered by a rechargeable battery and is operated with DC voltage, or an electrical tool which is operated with AC voltage. The switch has a housing in which the mount substrate is arranged. The mount substrate may just as well be arranged on one face of the housing, in particular as a housing part and/or as a side closure for the housing, with the mount substrate at the same time being used as a mount for the components and as a part of the housing. Furthermore, the mount substrate may at the same time be used as a heat sink, by that surface of the metal part which faces away from the coating projecting out of the housing as a heat sink. A multifunctional part such as this simplifies the switch and saves costs.

If the mount substrate is at the same time used as housing part, then it is possible for it to be non-planar and/or physically in the form of a cap. This ensures simple handling during assembly and installation of the switch. A further housing part, which in particular is composed of plastic, is fitted in the form of a cover, in order to complete the housing. With an appropriate configuration, the cover may be placed on the cap in the form of a seal, thus improving the sealing of the switch with respect to dust.

With electrical switches such as these for electrical tools, the power semiconductor, such as a MOSFET, a triac, a thyristor, a freewheeling diode or the like, is frequently arranged to supply the electric current for the electric motor in the housing. In this situation, it is expedient to provide at least one cutout in the coating, such that the power semiconductor is mounted directly on the metal part. The power semiconductor may in turn be mounted by soldering it onto the metal part. This provides effective heat dissipation from the interior of the switch, thus lengthening the life of the switch. In addition, a resistance track for a potentiometer may be applied to the coating by means of a resistance paste which can be burnt in.

The advantages which are achieved by the invention are, in particular, that improved heat dissipation is provided from the switch equipped with such a circuit arrangement. The switch is therefore more reliable. Fewer premature failures occur, and the life of the circuit arrangement is lengthened.

The electrical switch is suitable for operation at high power. In particular, the circuit arrangement can be arranged in the housing of the electrical switch even for power levels where, until now, the circuit arrangement had to be arranged separately from the switch in the electrical tool, for example in the cooling air flow for the electric motor.

Furthermore, the invention achieves cost savings, since no separate heat sink is required. The lack of a separate heat sink also reduces the physical size of the circuit arrangement. The circuit arrangement can then be accommodated even in confined installation spaces, for example in a narrow handle of an electrical tool.

BRIEF DESCRIPTION OF THE DRAWING

Exemplary embodiments of the invention, together with various developments and refinements, will be described in more detail in the following text and are illustrated in the drawings, in which.

DETAILED DESCRIPTION OF THE INVENTION

Figure 1:
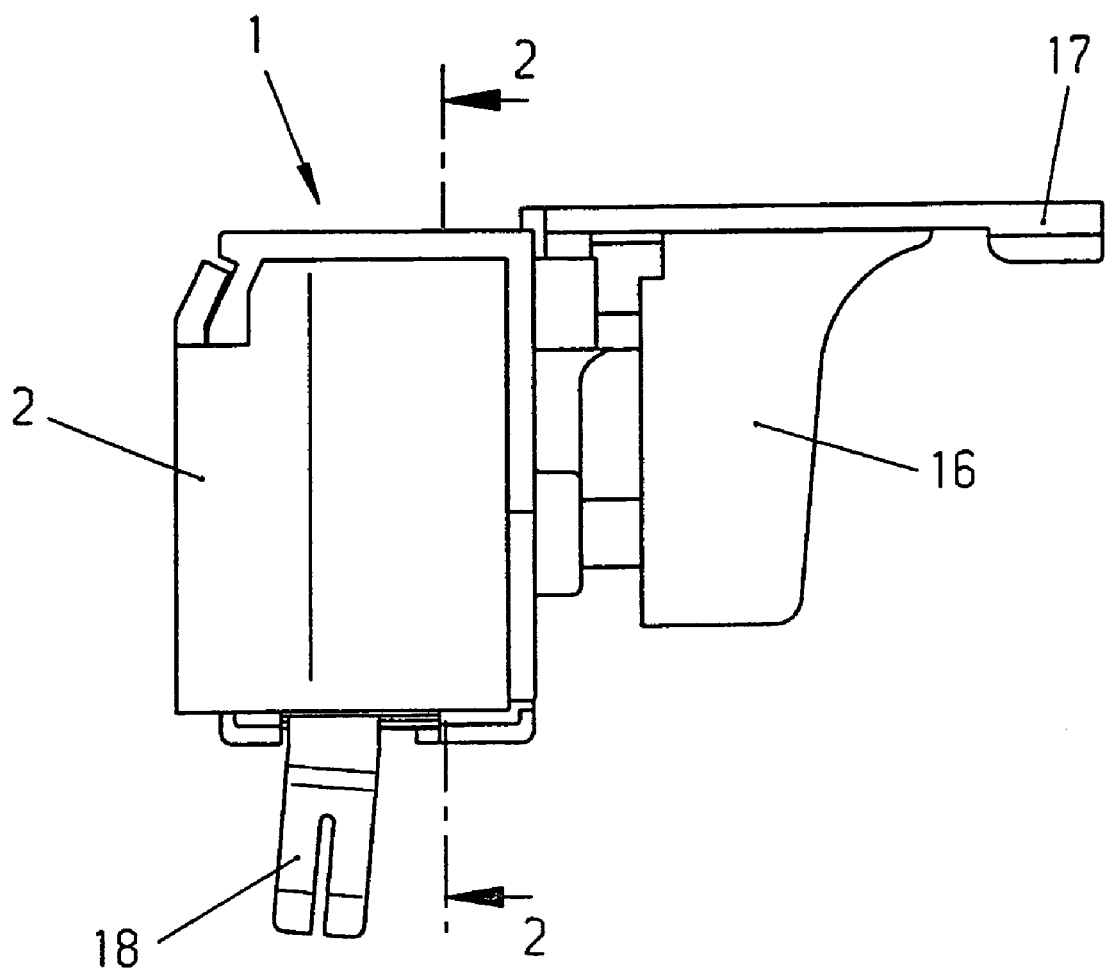
FIG. 1 shows a side view of an electrical switch.

FIG. 1 shows an electrical switch 1 which can be used for an electrical tool, to be precise in particular for an electrical tool which is powered by a rechargeable battery and is operated with DC voltage. The switch 1 has a housing 2, an operating member 16 which is in the form of a push button and is arranged on the housing 2 such that it can move, for manual operation of the electrical tool by the user, an operating element 17 in the form of a switching lever for switching the electrical tool to run clockwise or anti-clockwise, and connecting terminals 18 arranged on the housing 2, for electrical connection to the rechargeable battery. With an appropriate configuration, which will be explained in more detail in the following text, a switch 1 such as this may, of course, also be used for an electrical tool which is operated with AC voltage.

Figure 2:
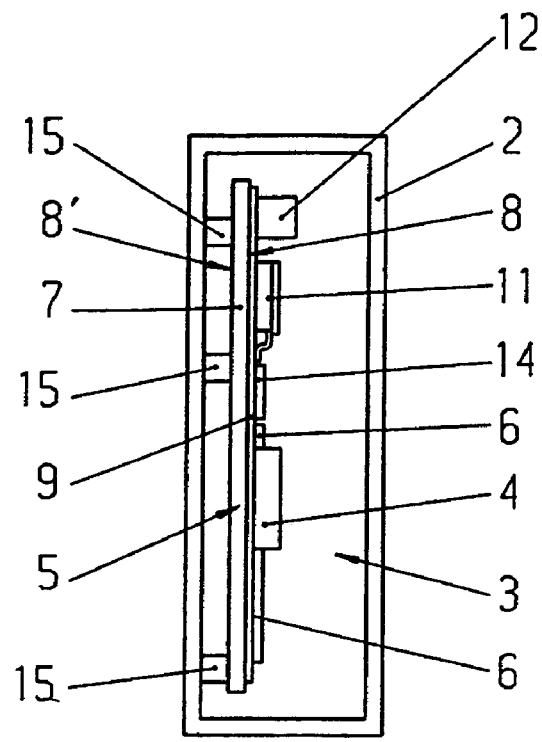
FIG. 2 shows a section along the line 2-2 in FIG. 1.

As is also illustrated schematically in FIG. 2, an electrical circuit arrangement 3 for controlling the rotation speed of the electric motor in the electrical tool is arranged in the housing 2. The circuit arrangement 3 may also include torque disconnection for the electric motor (which may be used, for example, for carrying out screwdriving work using the electrical tool), or may include some other functionality of the electrical tool. The circuit arrangement 3 thus contains at least some of the control electronics for the electric motor for the electrical tool. The housing 2 also contains further parts of the switch 1 in a manner known per se, such as the contact system or the like, although this will not be described in any more detail.

The circuit arrangement 3 has electrical and/or electronic components, which are arranged on a mount substrate 5. The conductor tracts 6 which lead to the components 4 or the like and produce their electrical connection are also located on the mount substrate 5, as can also be seen in more detail in FIG. 4. According to the invention, the mount substrate 5 comprises a metal part 7. An electrically insulating coating 9, that is to say a non-conductive coating 9, is applied to one surface 8 of the metal part 7, to be precise in particular to the surface 8 which faces components 4 and the conductor track tracks 6. At least one component 4 and/or at least one conductor track 6 of the circuit arrangement 3 are/is located on the coating 9. Most of the components 4, possibly with exceptions which will be explained in the following text, as well as all the conductor tracks 6 are preferably arranged on the coating 9, so that the electrical insulation provided by the coating 9 means that the components 4 and the conductor tracks 6 do not make electrical contact with metal part 7.

In one preferred refinement, the metal part 7 is composed of aluminum, or else of an aluminum alloy. By way of example, an AlMg3 alloy has been found to be particularly suitable for this purpose. The electrically insulating coating 9 is then composed of an anodized aluminum layer on the surface 8 of the aluminum metal part 7. The anodized aluminum layer expediently has a thickness of approximately 30 to 50 μm, in order on the one hand to achieve high thermal conductivity from the components 4 to the metal part 7, while on the other hand nevertheless providing good electrical insulation from the metal part 7.

The metal part 7 may also be composed of copper, steel or of some other highly thermally conductive metal or of a metal alloy. The electrically insulating coating 9 may also comprise a ceramic layer. A ceramic paste may be used as the ceramic material for producing the ceramic layer and is printed, rolled, sprayed or applied in some other way onto the surface 8 of the metal part 7. If necessary, the applied ceramic paste can then be burnt into the surface 8. A polymer layer, for example an epoxy layer, is likewise suitable for the coating 9. The polymer material may, for example, be printed, sprayed, rolled or applied in some other way onto the surface 8 of the metal part 7, for example as an uncured polymer resin. If necessary, the polymer material may then be cured in a known manner. A film, such as a plastic film, may likewise be used as the coating 9. The film material is then adhesively bonded, laminated or applied in some other way onto the surface 8 of the metal part 7.

As has been found, this allows the coating 9 to be designed for DC applications, so as to achieve a dielectric strength of at least 400 V. For AC applications, the coating 9 is produced with a thickness so as to achieve a dielectric strength of at least 2000 V. These minimum dielectric strengths may be necessary in particular when the circuit arrangement 3 is arranged in an electrical switch 1 in an electrical tool.

Figure 3:
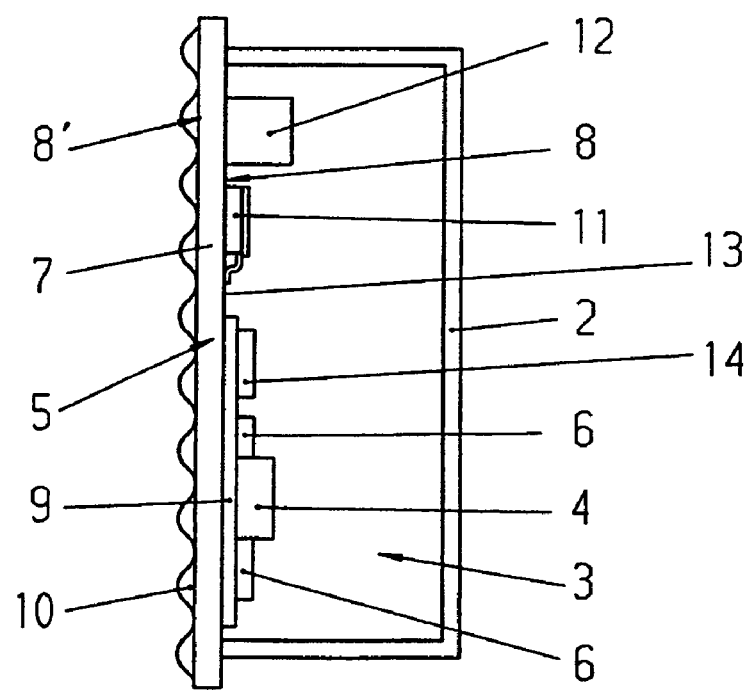
FIG. 3 shows a section, as in FIG. 2, of a further refinement.

The metal part 7 may have any desired shape, for example matched to the mounting 15 in the housing 2. The metal part 7 is frequently in the form of a plate, as can be seen in more detail in FIG. 2. The thickness of the plate is expediently at least 2 mm, in order to ensure good heat dissipation. Furthermore, the metal part 7 may also be in the form of a heat sink. In this case, the metal part 7 has cooling ribs 10 on the surface 8' which faces away from the electrically insulating coating 9, as is shown in FIG. 3. In order to simplify the embodiment as a heat sink, the metal part 7 may be produced as an extruded body.

The conductor tracks 6 on the electrically insulating coating 7 may be produced from copper, silver palladium or the like. For this purpose, this material may be applied to the coating 9 using thick film technology, as an appropriate paste, namely as a copper paste, silver palladium paste or the like. The paste is applied as appropriate for the structure required for the conductor tracks 6, for example by printing. If necessary, the paint is then also burnt into the coating 9. The electrical resistors can likewise be printed using a resistance paste, and can be burnt into the coating 9. This can be seen from the resistance track 14 in FIG. 4. The components 4 are preferably soldered onto the electrically insulating coating 9 in a vacuum. These components may, of course, also be SMD components 19, as can likewise be seen in FIG. 4.

Figure 4:
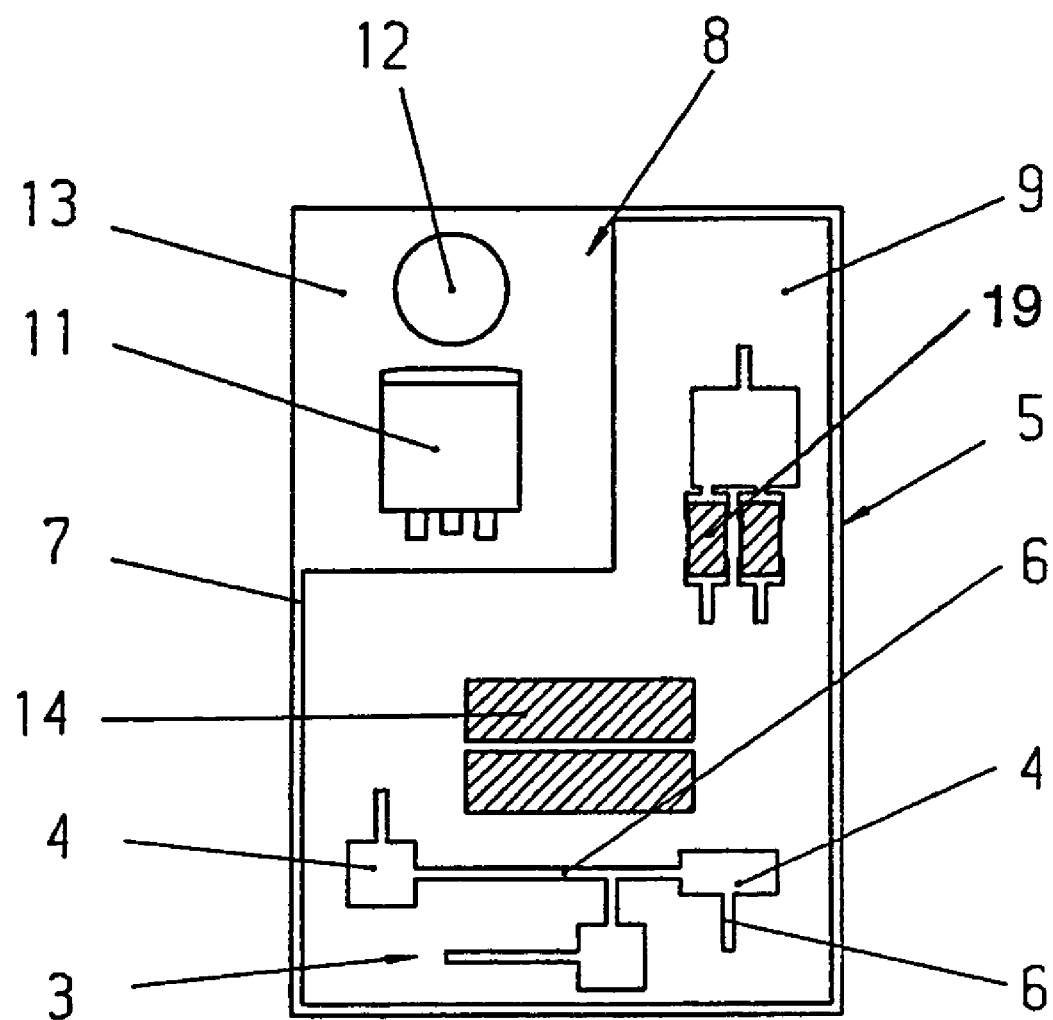
FIG. 4 shows a plan view of the mount substrate as shown in FIG. 3, as an individual part.

As is also shown in FIG. 4, at least one of the components is a power semiconductor 11, 12. The coating 9 has a cutout 13 in the area of the power semiconductor 11, 12 on the mount substrate 5. The power semiconductor 11, 12 is mounted directly in the cutout 13 on the metal part 7 and this may be done, for example, by soldering. Since comparatively high heat losses occur in the power semiconductor 11, 12 in the case of electrical tools, this measure ensures that the heat losses can be dissipated effectively. If the heat dissipation is sufficient the power semiconductor 11, 12 may, of course, also be mounted on the coating 9. In order to improve the heat dissipation effectiveness further, the power semiconductor 11, 12 may be in the form of a chip without a housing, which, for example, has a bonded connection for the corresponding conductor tracks 6 on the coating 9, although this is not shown in any more detail.

Figure 5:
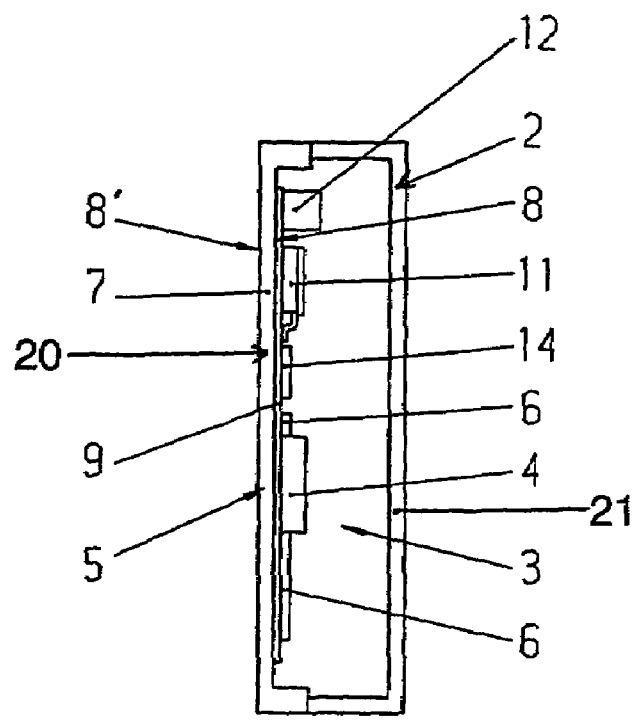
FIG. 5 shows a section, as in FIG. 2, based on a further exemplary embodiment.
Figure 6:
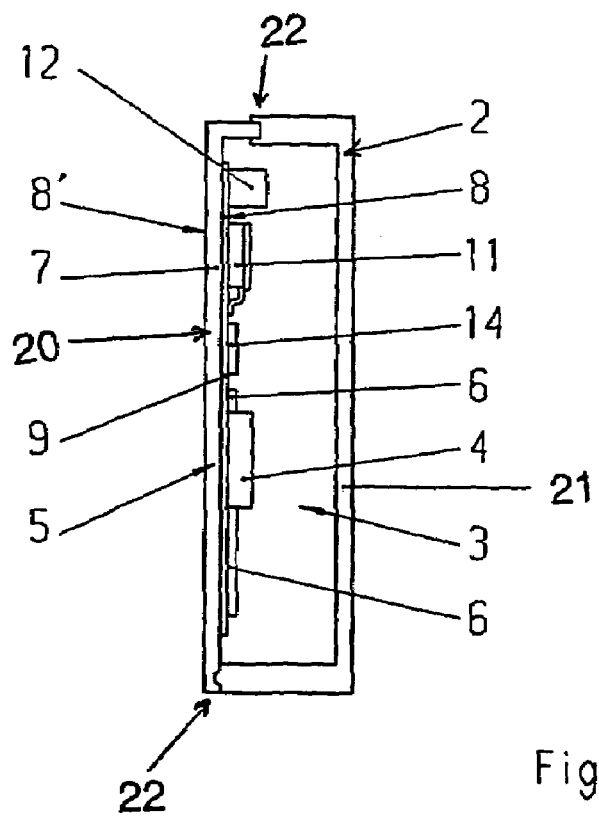
FIG. 6 shows a section, as in FIG. 2, based on yet another exemplary embodiment.

As already stated, the mount substrate 5 is arranged in the housing 2 of the electrical switch 1. As is illustrated in FIG. 2, the mount substrate 5 is expediently located on one face of the housing 2. That surface 8' of the metal part 7 which faces away from the coating 9 may also project out of the housing 2 as a heat sink, in particular with cooling ribs 10, as can be seen from FIG. 3. According to a further refinement, which is shown in FIG. 5 or 6, the mount substrate 5 may itself be in the form of a housing part. This housing part is then used as a side closure for the housing 2, so that there is no need for the corresponding side wall in the housing 2. Depending on the configuration of the housing 2, the mount substrate 5 which is used as a housing part may be physically in the form of a cap 20, and hence may be non-planar. As is shown in FIG. 5, a further housing part in the form of a cover 21 is fitted in order to complete the housing 2, so that the switch 1 can be assembled and installed particularly easily. The cover 21 may be composed of plastic in a normal manner while the cap 20 comprises the metal part 7. As is also shown in FIG. 6, an appropriate configuration by means of a tongue and groove connection 22 allows sealing to be achieved in a simple manner between the cap 20 and the cover 21. An additional seal may also, of course, be arranged between the cap 20 and the cover 21, although this is not shown in any more detail.

If the electrical switch 1 is an electrical switch for a high-power electrical tool which is powered by a rechargeable battery, then correspondingly high currents flow in the power electronics, which in turn results in a large amount of heat being produced. The invention allows not only the control electronics but also the power electronics to be accommodated in the electrical circuit arrangement 3 on the mount substrate 5 in the housing 2. The power electronics in the circuit arrangement 3 contain at least one power semiconductor, such as a MOSFET 11 for supplying current as a function of the electric motor rotation speed setting, and/or a freewheeling diode 12. However, the MOSFET 11 as well as the freewheeling diode 12 may also be arranged on the coating 9, as can be seen in FIG. 2. However, in this situation, it is preferable for the coating 9 to have at least one cutout 13, such that the power semiconductor 11, 12 is mounted directly on the metal part 7, as is illustrated in more detail in FIGS. 3 and 4. This is possible because the MOSFET 11 and the freewheeling diode 12 have a common potential in the circuit arrangement 3. The large amount of heat which is produced by the two power semiconductors 11, 12 owing to the high electric currents that flow is then dissipated directly to the mount substrate 5, without any further thermal resistance. Only a small number of electrical connection points, to be precise three electrical connection points, are now advantageously required from the mount substrate 5 to the actual contact system in the switch 1, which considerably reduces the amount of effort required to assemble and install the switch 1. The power semiconductors 11, 12 are expediently mounted on the metal part 7 by soldering.

If the heat that is produced requires this, the power semiconductor 11 for a switch 1 for a mains-powered electrical tool may, of course, also be mounted directly on the metal part 7 in a cutout 13. Since, in this situation, the electrical tool is operated from an AC voltage, the power semiconductor 11 for supplying current depending on the rotation speed of the electric motor may be a triac or a thyristor.

Finally, a resistance track 14 for a potentiometer is also located on the coating 9, with the potentiometer being set by the user, by means of the operating member 16 which is shown in FIG. 1. In consequence, the resistance track 14 produces a nominal signal, which corresponds to the electric motor rotation speed as chosen by the user by adjustment of the operating member 16. The resistance track 14 is, for example, applied to the coating 9 by means of a resistance paste which can be burnt in.

The invention is not restricted to the described and illustrated exemplary embodiments of a circuit arrangement 3 in the housing 2 of the electrical switch 1. This circuit arrangement 3 can also just as well be arranged at any other expedient point in the electrical tool. The invention also covers all developments by those skilled in the art within the scope of the patent claims. The invention may thus be used not only for electrical switches and electrical tools but, in fact, can also be used for circuit arrangements on mount substrates for controllers, domestic electrical appliances, electrical garden appliances, machine tools or the like.

LIST OF REFERENCE SYMBOLS

| | |
|---|---|
| 1: | Electrical switch |
| 2: | Housing |
| 3: | Electrical circuit arrangement |
| 4: | Component |
| 5: | Mount substrate |
| 6: | Conductor track |
| 7: | Metal part |
| 8, 8': | Surface (of the metal part) |
| 9: | (Insulating) coating (on the metal part) |
| 10: | Cooling ribs |
| 11: | MOSFET/power semiconductor |
| 12: | Freewheeling diode/power semiconductor |
| 13: | Cutout |
| 14: | Resistance track |
| 15: | Mounting (for the metal part) |
| 16: | Operating member |
| 17: | Operating element |
| 18: | Connecting terminals |
| 19: | SMD component |
| 20: | Cap |
| 21: | Cover |
| 22: | Tongue and groove connection |

The invention claimed is:

1. An electrical circuit arrangement comprising electrical and/or electronic components (4), conductor tracks (6) for electrical connection of the components (4), and a mount substrate (5), wherein the components (4) and the conductor tracks (6) are arranged on the mount substrate (5), wherein the mount substrate (5) comprises a metal part (7), which has an electrically insulating coating (9) on one surface of the metal part (7) which faces the components (4) and the conductor tracks (6), and wherein at least one component (4) and/or at least one conductor track (6) are/is located on the coating (9) and wherein the metal part (7) comprises a highly thermally conductive metal selected from aluminum, aluminum alloy, steel or metal alloy and wherein the electrically insulating coating (9) has a dielectric strength of at least 400 V for DC applications, and has a dielectric strength of at least 2000 V for AC applications and wherein at least one component is a power semiconductor (11, 12), the coating (9) has a cutout (13), such that the power semiconductor (11, 12) is mounted directly on the metal part (7), or the power semiconductor (11, 12) is mounted on the coating (9), and the power semiconductor (11, 12) is in the form of a chip without a housing and has a bonded connection for the conductor track (6) on the coating.

2. The electrical circuit arrangement as claimed in claim 1, wherein the highly thermally conductive metal is aluminum or an aluminum alloy and the electrically insulating coating (9) comprises an anodized aluminum layer which has a thickness of approximately 30 to 50 µm, such that this anodized aluminum layer has high thermal conductivity and good electrical insulation.

3. The electrical circuit arrangement as claimed in claim 1, wherein the highly thermally conductive metal is steel or metal alloy.

4. The electrical circuit arrangement as claimed in claim 1, wherein the electrically insulating coating (9) comprises a ceramic layer, with the ceramic material being printed, rolled or sprayed onto the surface (8) of the metal part (7), in the form of a ceramic paste, and if required being burnt in.

5. The electrical circuit arrangement as claimed in claim 1, wherein the electrically insulating coating (9) comprises a polymer layer.

6. The electrical circuit arrangement as claimed in claim 1, wherein the electrically insulating coating (9) comprises a film, with the film material being adhesively bonded or laminated onto the surface (8) of the metal part (7).

7. The electrical circuit arrangement as claimed in claim 1, wherein the metal part (7) is in the form of a plate, whose thickness is at least 2 mm.

8. The electrical circuit arrangement as claimed in claim 1, wherein the metal part (7) is in the form of a heat sink, with cooling ribs (10) on the surface (8') facing away from the electrically insulating coating (9), and the metal part (7) is produced from an extruded body.

9. The electrical circuit arrangement as claimed in claim 1, wherein the conductor tracks 6 on the electrically insulating coating (9) are composed of copper or silver palladium and the conductor tracks and/or the printed resistors (14) are applied to the coating (9) as an appropriate paste in the form of a thick-film technique, and if required then burnt in, and the components (4) are soldered onto the electrically insulating coating (9) in a vacuum.

10. The electrical circuit arrangement as claimed in claim 2, wherein the aluminum alloy is an AlMg3 alloy.

11. The electrical circuit arrangement as claimed in claim 5, wherein the polymer layer is an epoxy layer.

12. The electrical circuit arrangement as claimed in claim 5 wherein the polymer layer is one of printed, sprayed, or rolled onto the surface (8) of the metal part (7) in the form of a polymer resin, and if required being cured.

13. An electrical switch in combination with an electrical tool comprising:
a housing (2), and an electronic circuit arrangement, wherein the electronic circuit arrangement comprises:
a mount substrate (5) comprised of a metal part (7) and having an electrically insulating coating (9) on a surface of the metal part (7);
electrical and/or electronic components (4) arranged on the mount substrate (5); and conductor tracks (6) for electrical connection of the components (4) arranged on the mount substrate (5), wherein the electrically insulating coating (9) is provided on a metal part surface that faces components (4) and the conductor tracks (6) arranged on the mount substrate (5) so that at least one component (4) and/or at least one conductor track (6) are/is located on the coating (9), wherein the mount substrate (5) is arranged on one face of the housing (2), as a part of the housing (2) and wherein the tool is powered by a rechargeable battery and is operated with DC voltage or the tool is operated with AC voltage.

14. The electrical switch in combination with the electrical tool as claimed in claim 13, wherein the mount substrate (5) which is used as a housing part is non-planar and/or is physically in the form of a cap (20), such that a further housing part, which is composed of plastic and is fitted in the form of a cover (21), forms a seal, in order to complete the housing (2).

15. The electrical switch in combination with the electrical tool as claimed in claim 13, wherein the circuit arrangement (3) contains at least one power semiconductor, selected from MOSFET (11), a triac, a thyristor, or a freewheeling diode (12)-the coating (9) has at least one cutout (13), allowing the power semiconductor (11, 12) to be mounted directly on the metal part (7) and wherein a resistance track (14) for a potentiometer is applied to the coating (9).

16. The electrical switch in combination with the electrical tool as claimed in claim 13, wherein at least one component is a power semiconductor (11, 12), wherein the coating (9) has a cutout (13), such that the power semiconductor (11, 12) is mounted directly on the metal part (7), or the power semiconductor (11, 12) is mounted on the coating (9), and wherein the power semiconductor (11, 12) is in the form of a chip without a housing and has a bonded connection for the conductor track (6) on the coating.

17. The electrical switch in combination with the electrical tool as claimed in claim 13 wherein the metal part (7) has a surface (8') which faces away from the coating (9) and projects out of the housing (2) as a heat sink.

18. An electrical switch in combination with an electrical tool comprising:
a housing (2), and an electronic circuit arrangement, wherein the electronic circuit arrangement comprises:
a mount substrate (5) comprised of a metal part (7) and having an electrically insulating coating (9) on a surface of the metal part (7);
electrical and/or electronic components (4) including a power semiconductor (11,12) arranged on the mount substrate (5); and
conductor tracks (6) for electrical connection of the components (4) arranged on the mount substrate (5),
wherein the electrically insulating coating (9) is provided on a metal part surface that faces components (4) and the conductor tracks (6) arranged on the mount substrate (5) so that at least one component (4) and/or at least one conductor track (6) are/is located on the coating (9), wherein the electrically insulating coating (9) has a cut-out such that the power semiconductor is mounted directly on the metal part (7), wherein the mount substrate (5) is arranged in one of within the housing (2) or on one face of the housing (2), as a part of the housing (2) and wherein the tool is powered by a rechargeable battery and is operated with DC voltage or the tool is operated with AC voltage.

19. The electrical switch as claimed in claim 18, wherein the mount substrate (5) which is used as a housing part is non-planar and/or is physically in the form of a cap (20), such that a further housing part, which is composed of plastic and is fitted in the form of a cover (21), forms a seal, in order to complete the housing (2).

20. The electrical switch as claimed in claim 18, wherein the circuit arrangement (3) contains at least one power semiconductor, selected from MOSFET (11), a triac, a thyristor, or a freewheeling diode (12), the coating (9) has at least one cutout (13), allowing the power semiconductor (11, 12) to be mounted directly on the metal part (7) and wherein a resistance track (14) for a potentiometer is applied to the coating (9).

21. The electrical switch as claimed in claim 18, wherein at least one component is a power semiconductor (11, 12), wherein the coating (9) has a cutout (13), such that the power semiconductor (11, 12) is mounted directly on the metal part (7), or the power semiconductor (11, 12) is mounted on the coating (9), and wherein the power semiconductor (11, 12) is in the form of a chip without a housing and has a bonded connection for the conductor track (6) on the coating.

22. An electrical switch as claimed in claim 18 wherein the metal part (7) has a surface (8') which faces away from the coating (9) and projects out of the housing (2) as a heat sink.

23. An electrical switch in combination with an electrical tool comprising:
a housing (2), and an electronic circuit arrangement, wherein the electronic circuit arrangement comprises:
a mount substrate (5) comprised of a metal part (7) and having an electrically insulating coating (9) on a surface of the metal part (7);
electrical and/or electronic components (4) arranged on the mount substrate (5); and
conductor tracks (6) for electrical connection of the components (4) arranged on the mount substrate (5),
wherein the electrically insulating coating (9) is provided on a surface of the metal part that faces components (4) and the conductor tracks (6) arranged on the mount substrate (5) so that at least one component (4) and/or at least one conductor track (6) are/is located on the coating (9) and wherein the mount substrate (5) is arranged in one of within the housing (2) or on one face of the housing (2), as a part of the housing (2) and wherein the metal part (7) has an outer surface (8') which faces away from the coating (9) and projects out of the housing (2) as a heat sink.

* * * * *